United States Patent
Wang

(10) Patent No.: US 11,190,225 B2
(45) Date of Patent: Nov. 30, 2021

(54) TRANSMITTER WITH SELF-INTERFERENCE CALIBRATION ABILITY AND TRANSMISSION METHOD WITH SELF-INTERFERENCE CALIBRATION ABILITY

(71) Applicant: REALTEK SEMICONDUCTOR CORPORATION, Hsinchu (TW)

(72) Inventor: Chih-Chieh Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/039,400

(22) Filed: Sep. 30, 2020

(65) Prior Publication Data
US 2021/0328607 A1    Oct. 21, 2021

(30) Foreign Application Priority Data
Apr. 15, 2020    (TW) ................. 109112689

(51) Int. Cl.
*H04B 17/11* (2015.01)
*H04B 17/19* (2015.01)
(Continued)

(52) U.S. Cl.
CPC .......... *H04B 1/0475* (2013.01); *H03L 7/0991* (2013.01); *H04B 17/11* (2015.01); *H04L 7/0331* (2013.01)

(58) Field of Classification Search
CPC ... H03L 2207/50; H03L 7/101; H03L 7/0991; H04L 2027/0018; H04L 7/0331; H04B 1/0475; H04B 1/123
See application file for complete search history.

(56) References Cited

U.S. PATENT DOCUMENTS

| 8,804,874 B2* | 8/2014 | Wang ............... H04L 7/0331 375/302 |
| 2005/0186920 A1* | 8/2005 | Staszewski ............ H03L 7/16 455/114.1 |

(Continued)

OTHER PUBLICATIONS

Eliezer, O. E., Staszewski, R. B., Bashir, I., Bhatara, S., & Balsara, P. T. (2009). A Phase Domain Approach for Mitigation of Self-Interference in Wireless Transceivers. IEEE Journal of Solid-State Circuits, 44(5), 1436-1453. doi:10.1109/jssc.2009.2014941.

(Continued)

*Primary Examiner* — David S Huang
(74) *Attorney, Agent, or Firm* — WPAT, P.C., Intellectual Property Attorneys; Anthony King

(57) ABSTRACT

The application discloses a transmitter with self-interference calibration ability, including: a signal generation unit for generating a signal; a CORDIC for generating an amplitude modulation signal and a phase modulation signal according to the signal; phase processing unit, for generating a frequency signal according to the phase modulation signal; a DPLL, including: a DCO, self-interference calibration unit, for generating phase compensation according to the signal, a phase difference and a reference clock; and a DCO control generation unit; and an output unit, for generating an output signal according to the amplitude modulation signal and a DCO output signal.

20 Claims, 6 Drawing Sheets

(51) Int. Cl.
  *H04B 17/10*   (2015.01)
  *H04B 1/04*    (2006.01)
  *H04L 7/033*   (2006.01)
  *H03L 7/099*   (2006.01)

(56) References Cited

U.S. PATENT DOCUMENTS

| | | |
|---|---|---|
| 2009/0141845 A1 | 6/2009 | Ballantyne et al. |
| 2012/0057655 A1* | 3/2012 | Marsili ............. H04L 27/361 375/300 |
| 2012/0319749 A1 | 12/2012 | Thaller et al. |
| 2013/0156129 A1* | 6/2013 | Li Puma ............ H04L 27/367 375/296 |
| 2016/0142230 A1* | 5/2016 | Eliezer ............. H04B 1/0475 375/238 |
| 2019/0052452 A1* | 2/2019 | Perlmutter ........... H03L 7/093 |

OTHER PUBLICATIONS

Kieffer, J., Rieubon, S., Houdebine, M., Dedieu, S., & Novakov, E. (2013). Three-Points Modulator Based on DPLL for Wideband Polar Modulation. Communications and Network, 05(03), 140-143. doi:10.4236/cn.2013.53b2027.

* cited by examiner

TRANSMITTER WITH SELF-INTERFERENCE CALIBRATION ABILITY AND TRANSMISSION METHOD WITH SELF-INTERFERENCE CALIBRATION ABILITY

CROSS REFERENCE TO RELATED APPLICATIONS

This application claims priority of Taiwan application No. 109112689 filed on Apr. 15, 2020, which is incorporated by reference in its entirety.

TECHNICAL FIELD

The present application relates to a transmitter; in particular, to a transmitter with self-interference calibration ability transmitter and a related method.

BACKGROUND

For modern wireless communication systems, the polar transmitter architecture is quite competitive because it has smaller area and less power consumption, compared to the traditional analog architecture. Polar transmitter architecture, when used in connection with a digital phase-locked loop (DPLL) with two-point modulation or three-point modulation can increase the bandwidth of polar transmitters; however, it comes with the disadvantage that the transmitted signal may interfere with the crystal oscillator supplying the DPL; this self-interference phenomenon will increase the jitter of the output clock of the above-mentioned crystal oscillator, resulting in the degradation of the signal quality. Therefore, a compensation method is needed to solve the above-mentioned issue.

SUMMARY OF THE INVENTION

Some embodiments of the present disclosure provide a transmitter with self-interference calibration ability, including: a signal generation unit, configured to generate an IQ signal; a coordinate rotation digital computer (CORDIC), configured to generate an amplitude modulation signal and a phase modulation signal according to the IQ signal; a phase processing unit, configured to generate a frequency signal according to the phase modulation signal; a digital phase-locked loop (DPLL), including; a digitally controlled oscillator (DCO), configured to generate a DCO output signal according to a DCO control signal; a frequency divider, configured to divide frequency of the DCO output signal using a frequency dividing parameter to generate a frequency divided signal; a time-to-digital converter, configured to generate phase difference according to the frequency signal, the frequency divided signal and a reference clock; a self-interference calibration unit, configured to generate a compensation phase according to the IQ signal, the phase difference and the reference clock; and a DCO control signal generation unit, configured to generate the DCO control signal according to the frequency signal, the phase difference and the compensation phase; and an output unit, configured to generate an output signal according to the amplitude modulation signal and the DCO output signal.

Some embodiments of the present disclosure provide a transmission method with self-interference calibration ability, including: generating an IQ signal; generating an amplitude modulation signal and a phase modulation signal according to the IQ signal; generating a frequency signal according to the phase modulation signal; generating a DCO output signal according to a DCO control signal; using a frequency dividing parameter to divide frequency of the DCO output signal so as to generate a frequency divided signal; generating a phase difference according to the frequency signal, the frequency divided signal and the reference clock; generating a compensation phase according to the IQ signal, the phase difference and the reference clock; generating the DCO control signal according to the frequency signal, the phase difference and the compensation phase; and generating an output signal according to the amplitude modulation signal and the DCO output signal.

The above apparatus and method mitigate self-interference and reduce jitter of the reference clock, thereby improving the signal quality.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of some features may be arbitrarily increased or reduced for clarity of discussion.

DETAILED DESCRIPTION

Figure 1:
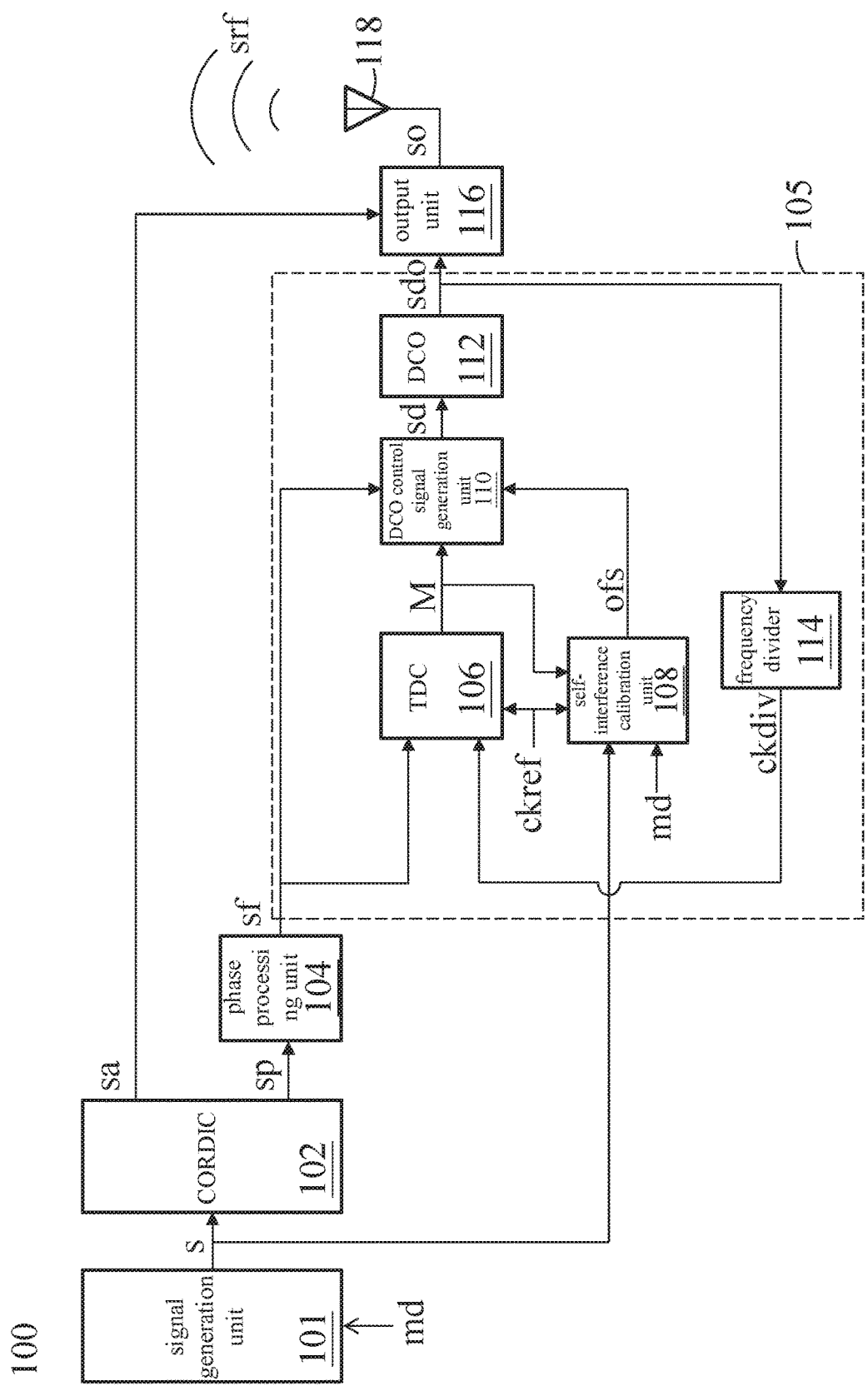
FIG. 1 is a schematic diagram illustrating a transmitter with self-interference calibration ability according to the present application.

FIG. 1 is a schematic diagram illustrating a transmitter with self-interference calibration ability according to the present application. The transmitter 100 adopts the polar transmitter architecture in combination with a digital phase-locked loop (DPLL) 105, a signal generation unit 101 configured to generate an IQ signal s, a coordinate rotation digital computer (CORDIC) 102 configured to generate an amplitude modulation signal sa and a phase modulation signal sp according to the IQ signal s, wherein the phase modulation signal sp generates a frequency signal sf after passing through a phase processing unit 104, and the DPLL 105 generates a DCO output signal sdo according to a frequency signal sf and a reference clock ckref, wherein the reference clock ckref is generated by a crystal oscillator (not shown in the drawings); an output unit 116 synthesizes an output signal so according to the amplitude modulation signal sa and the DCO output signal sdo, and then an antenna 118 generates a transmission signal srf to be transmitted. In some embodiments, the output unit 116 also includes a power amplifier.

In the DPLL 105, a digitally controlled oscillator (DCO) 112 generates a DCO output signal sdo according to the DCO control signal sd, a frequency divider 114 uses a frequency dividing parameter N to divide frequency of the DCO output signal sdo to generate a frequency divided signal ckdiv, which is fed back to a time-to-digital converter (TDC) 106, the TDC 106 generates a phase difference M according to the frequency signal sf, the frequency divided signal ckdiv and the reference clock ckref, a self-interference calibration unit 108 generates a compensation phase ofs according to the IQ signal s, the phase difference M and the reference clock ckref, a DCO control signal generation unit 110 generates a DCO control signal sd to the DCO 112 according to the frequency signal sf, the phase difference M and the compensation phase ofs. In some embodiments, the DCO control signal generation unit 110 may further include a loop filter.

The transmitter 100 may operate in a test mode or a normal mode depending on the mode signal md. In order to mitigate the interference that the transmission signal srf imposes on the crystal oscillator (i.e., in order to reduce the jitter that the transmission signal srf causes to the generate reference clock ckref), reference information shall be collected during the test mode transmitter 100, so that such reference information can be used to perform self-interference calibration in the normal mode, the detail of which is discussed below.

The transmission signal srf can be expressed as below:

$$\{A_{mod}(t) * e^{j[\theta_{mod}(t)+\theta_{fc}(t)]}\} \quad (1),$$

wherein $A_{mod}$ represents the amplitude of the transmission signal srf, $\theta_{mod}$ represents the phase of the modulation portion of the transmission signal srf, $\theta_{fc}$ represents the phase of the carrier wave portion of the transmission signal srf. The transmission signal srf forms an interference signal I:

$$I(t) = \gamma * e^{j\Phi} \{A_{mod}(t)\}^2 * e^{j[2*\theta_{mod}(t)+2*\theta_{fc}(t)]} \quad (2),$$

wherein $\gamma$ is a coupling coefficient, $\gamma * e^{j\Phi}$ represents the degradation and phase change generated when the transmission signal srf moves from a transmission position to the crystal oscillator, and since the frequency of the transmission signal srf is the frequency $f_{dco}$ of the DCO output signal sdo, the equation (2) can be re-written into equation (3) below:

$$I(t) = \gamma * e^{j\Phi} [A_{mod}(t)]^2 * e^{j[2*2\pi*f_{dco}*t]} \quad (3).$$

Set $$I(t) = \gamma * [A_{mod}(t)]^2 * e^{j[2*2\pi*N*f_{xtal}*t+\varphi_k(t)]} \quad (4)$$

wherein $f_{xtal}$ is the frequency of the reference clock ckref, $f_{dco}(t)$ can be expressed as:

$$f_{dco}(t) = f_c + f_{mod}(t) \quad (5),$$

wherein $f_c$ represents the frequency of the carrier portion of the transmission signal srf, and $f_{xtal}$ has a proportional relationship of N folds, and hence, the equation (5) can be re-written into:

$$f_{dco}(t) = N*f_{xtal} + f_{mod}(t) \quad (6);$$

hence, in equation (4):

$$\varphi_k(t) = 2*2\pi*f_{mod}(t)*t + \Phi \quad (7),$$

wherein the phase of jitter that the interference signal I cause to the reference clock ckref can be expressed as:

$$\theta_{jitter}(t) = \lambda(t)*I(t) \quad (8);$$

equation (8) can further be expressed as:

$$\theta_{jitter}(t) = 2\pi*2*\left[f_c + \frac{d\theta_{mod}(t)}{dt}\right]*t_{jitter}, \quad (9)$$

wherein $t_{jitter}$ is the level of jitter. Assuming $I(t+t_{jitter}) \approx I(t)$, then $$t_{jitter} = \frac{I(t)}{A_{xtal}*2\pi*f_{xtal}}, \quad (10)$$

wherein $A_{xtal}$ is the amplitude of the reference clock ckref, and the following equation can be obtained according to equations (8) to (10):

$$\lambda(t) = 2\pi*2*\left[f_c + \frac{d\theta_{mod}(t)}{dt}\right]*\frac{1}{A_{xtal}*2\pi*f_{xtal}} = \quad (11)$$

$$\frac{2*[f_c + f_{mod}(t)]}{A_{xtal}*f_{xtal}} = \lambda_0 + \frac{2}{A_{xtal}}*\frac{f_{mod}(t)}{f_{xtal}},$$

wherein $$\lambda_0 = \frac{2}{A_{xtal}}N.$$

Since $$f_c \gg \frac{d\theta_{mod}(t)}{A_{xtal}},$$

it can be assumed that in equation (9), $\theta_{jitter}(t) = 2\pi*2*f_c*t_{jitter}$, and hence:

$$t_{jitter} = \frac{\theta_{jitter}(t)}{2\pi*2*f_c} = \frac{\left[\lambda_0 + \frac{2}{A_{xtal}}*\frac{f_{mod}(t)}{f_{xtal}}\right]*I(t)}{2\pi*2*f_c} = \quad (12)$$

$$\frac{\left[\frac{2}{A_{xtal}}(N+M_{fractional})\right]*I(t)}{2\pi*2*f_c} + \frac{\left[\frac{2}{A_{xtal}}*\frac{f_{mod}(t)}{f_{xtal}}\right]*I(t)}{2\pi*2*f_c} =$$

$$\frac{I(t)}{A_{xtal}*2\pi*f_{xtal}} + \frac{\left[\frac{f_{mod}(t)}{f_c}\right]*I(t)}{A_{xtal}*2\pi*f_{xtal}} =$$

$$\frac{I(t)}{A_{xtal}*2\pi*f_{xtal}}*\left[1 + \frac{f_{mod}(t)}{f_c}\right]$$

In the present embodiment, in the test mode, the IQ signal can be a sine wave (however, the present application is not limited thereto); take the sinusoidal wave as an example, the following equation can be obtained according to equation (3) and (5):

$$I(t) = \gamma * [A_{sin}(t)]^2 * e^{j[2*\theta_{sin}(t)+2*\theta_{fc}(t)]} \quad (13),$$

wherein $A_{sin}$ represents the amplitude of the sinusoidal wave, $\theta_{sin}$ represents the phase of the sinusoidal wave, and since $f_c \gg f_{sin}$, the following equation can be obtained according to equation (12) and (13):

$$t_{jitter} = \frac{\gamma*[A_{sin}(t)]^2*e^{j[2*\theta_{sin}(t)+2*\theta_{fc}(t)]}}{A_{xtal}*2\pi*f_{xtal}}*\left[1 + \frac{f_{sin}}{f_c}\right] \approx \quad (14)$$

-continued $$\frac{\gamma * [A_{\sin}(t)]^2 * e^{j[2*\theta_{\sin}(t)+2*\theta_{fc}(t)]}}{A_{xtal} * 2\pi * f_{xtal}},$$

wherein $$\frac{[A_{\sin}(t)]^2 * e^{j[2*\theta_{\sin}(t)+2*\theta_{fc}(t)]}}{A_{xtal} * 2\pi * f_{xtal}}$$

is known, and is set as the intensity coefficient $K_{sin}(t)$. In this case, from the output result of the TDC 106, $t_{jitter}(i)=T_q * (M[i]-M_{ideal}[i])=\gamma_{sin}(i)*K_{sin}(i)$, wherein $T_q$ is the resolution of the TDC 106, $M_{ideal}[i]$ and $M[i]$ are respectively the phase difference when there is no interference and the phase difference when it is interfered by interference signal I; in the present embodiment, the non-interfered phase difference $M_{ideal}[i]$ can be obtained by setting the amplitude $A_{sin}$ of the sinusoidal wave as a relatively smaller value. In this case:

$$\text{the coupling coefficient } \gamma_{sin}(i) = T_q * \frac{M[i] - M_{ideal}[i]}{K_{sin}(i)}, \quad (15)$$

and since $$\gamma_{mod}(i) = \gamma_{sin}(i) * \frac{K_{sin}(i)}{K_{mod}(i)}, \quad (16)$$

in the test mode, it is feasible to fine a plurality of coupling coefficients $\gamma_{sin}(i)$ corresponding to a plurality of IQ signals s with different amplitudes $A_{sin}$, and then, in the normal mode, the relationship between the intensity coefficient $K_{mod}(i)$ obtained in the normal mode and the intensity coefficient $K_{sin}(i)$ obtained in the test mode can be used to find corresponding $\gamma_{sin}(i)$, which is then multiplied by a known $$\frac{K_{sin}(i)}{K_{mod}(i)}$$

to obtain $\gamma_{mod}(i)$, and the $t_{jitter}(i)$ on the normal mode can be obtained by multiplying $\gamma_{mod}(i)$ with $K_{mod}(i)$.

Figure 2:
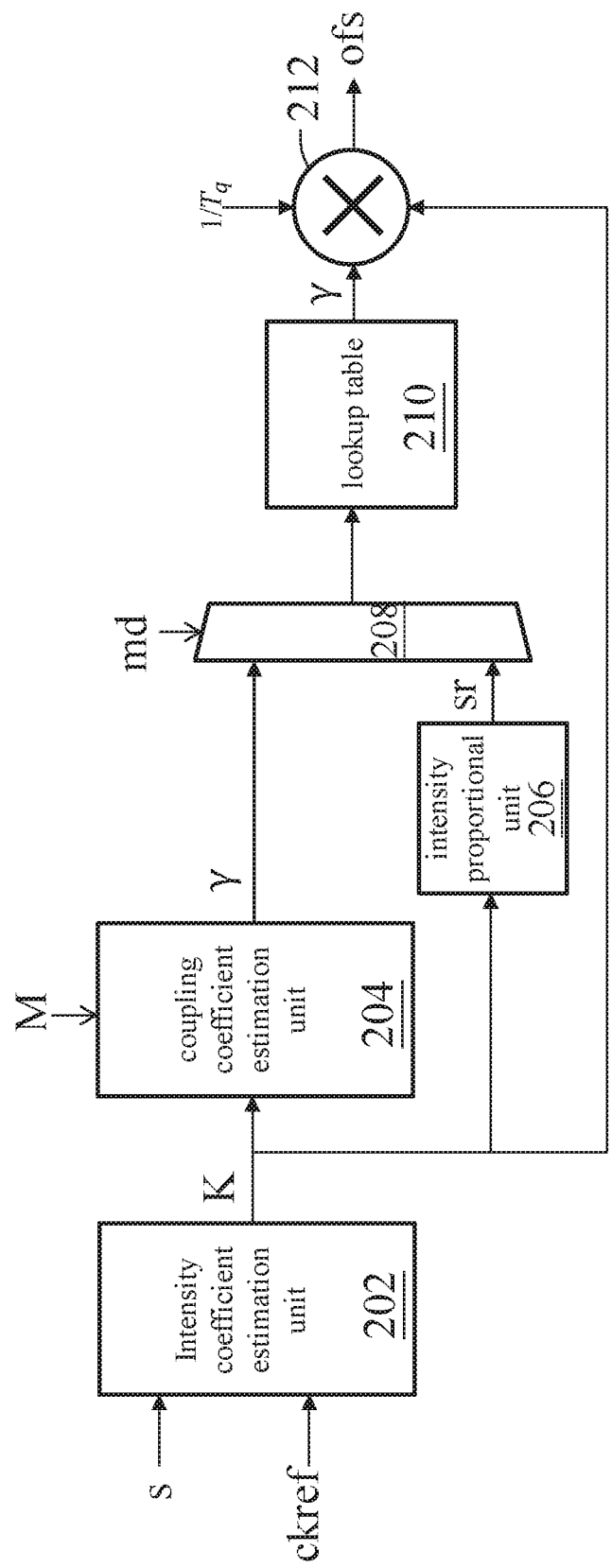
FIG. 2 is a schematic diagram illustrating an embodiment of a self-interference calibration unit of FIG. 1.
Figure 3:
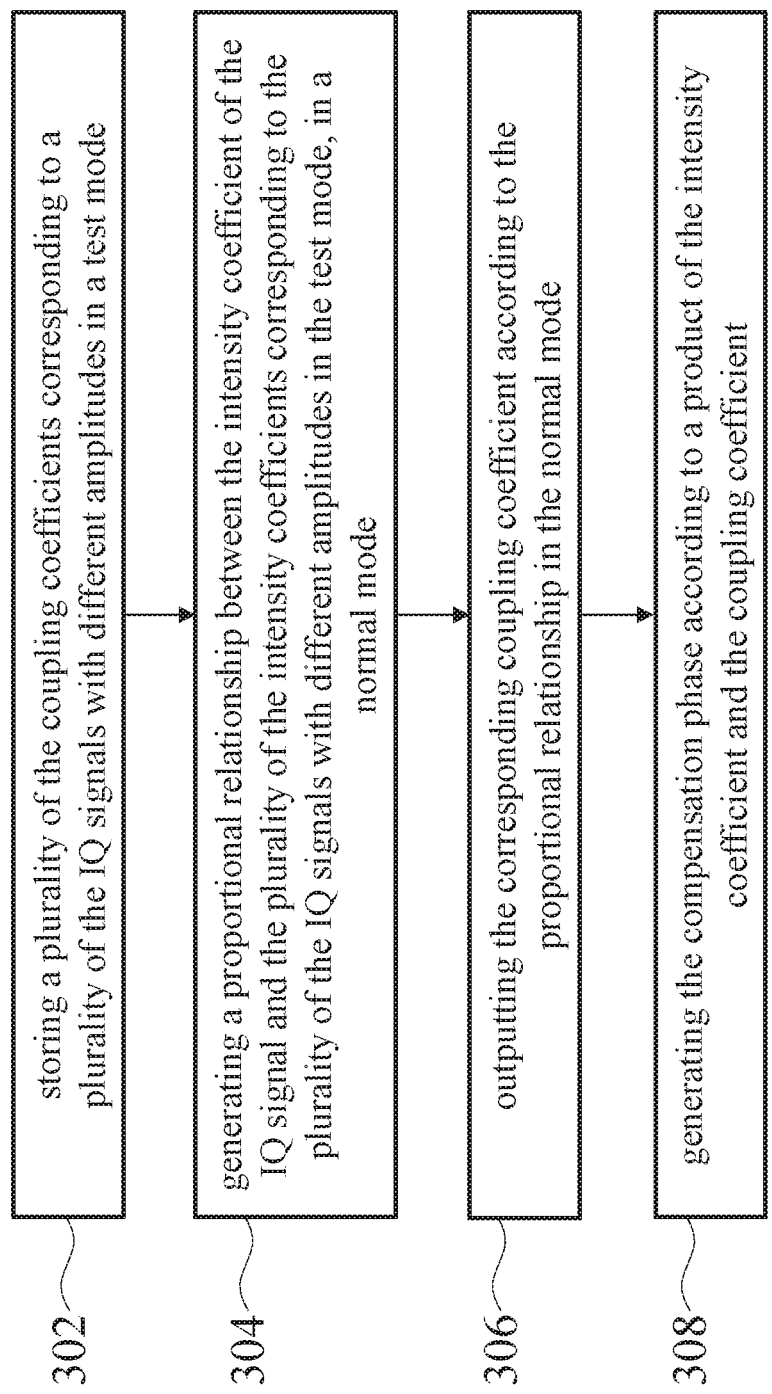
FIG. 3 shows the compensation method of the self-interference calibration unit of FIG. 1.

FIG. 2 is a schematic diagram illustrating an embodiment of a self-interference calibration unit 108 of FIG. 1. The self-interference calibration unit 108 is configured to find a compensation phase in the normal mode using the above-mentioned equations the normal mode, and FIG. 3 shows the related compensation method. The intensity coefficient estimation unit 202 generates an intensity coefficient K according to the IQ signal s and the reference clock ckref; that is, the intensity coefficient $K_{sin}(i)$ is generated in the test mode, and the intensity coefficient $K_{mod}(i)$ is generated in the normal mode. The coupling coefficient estimation unit 204 is configured to generate a coupling coefficient γ according to the intensity coefficient K and the phase difference M; that is, the coupling coefficient $\gamma_{sin}(i)$ is generated in the test mode, and the coupling coefficient $\gamma_{mod}(i)$ is generated in the normal mode. When the mode signal md indicates that it is in the test mode, a selector 208 will input a plurality of coupling coefficients $\gamma_{sin}(i)$ corresponding to a plurality of IQ signals s with different amplitudes $A_{sin}$ and store the same in the lookup table 210 (Step 302).

In the normal mode, the intensity proportional unit 206 is configured to generate a proportional relationship sr between the intensity coefficient $K_{mod}(i)$ of the IQ signal s and the plurality of intensity coefficients $K_{sin}(i)$ corresponding to the plurality of IQ signals s with different amplitudes $A_{sin}$ obtained in the test mode (Step 304). When the mode signal md indicates that it is now in the normal mode, the lookup table 210 will find the corresponding coupling coefficient $\gamma_{mod}(i)$ according to the proportional relationship sr and the plurality of coupling coefficients $\gamma_{sin}(i)$ (Step 306). A multiplier 212 is used to multiply the coupling coefficient $\gamma_{mod}(i)$ with the intensity coefficient $K_{mod}(i)$ and $1/T_q$, thereby obtaining a compensation phase ofs (Step 308).

Figure 4:
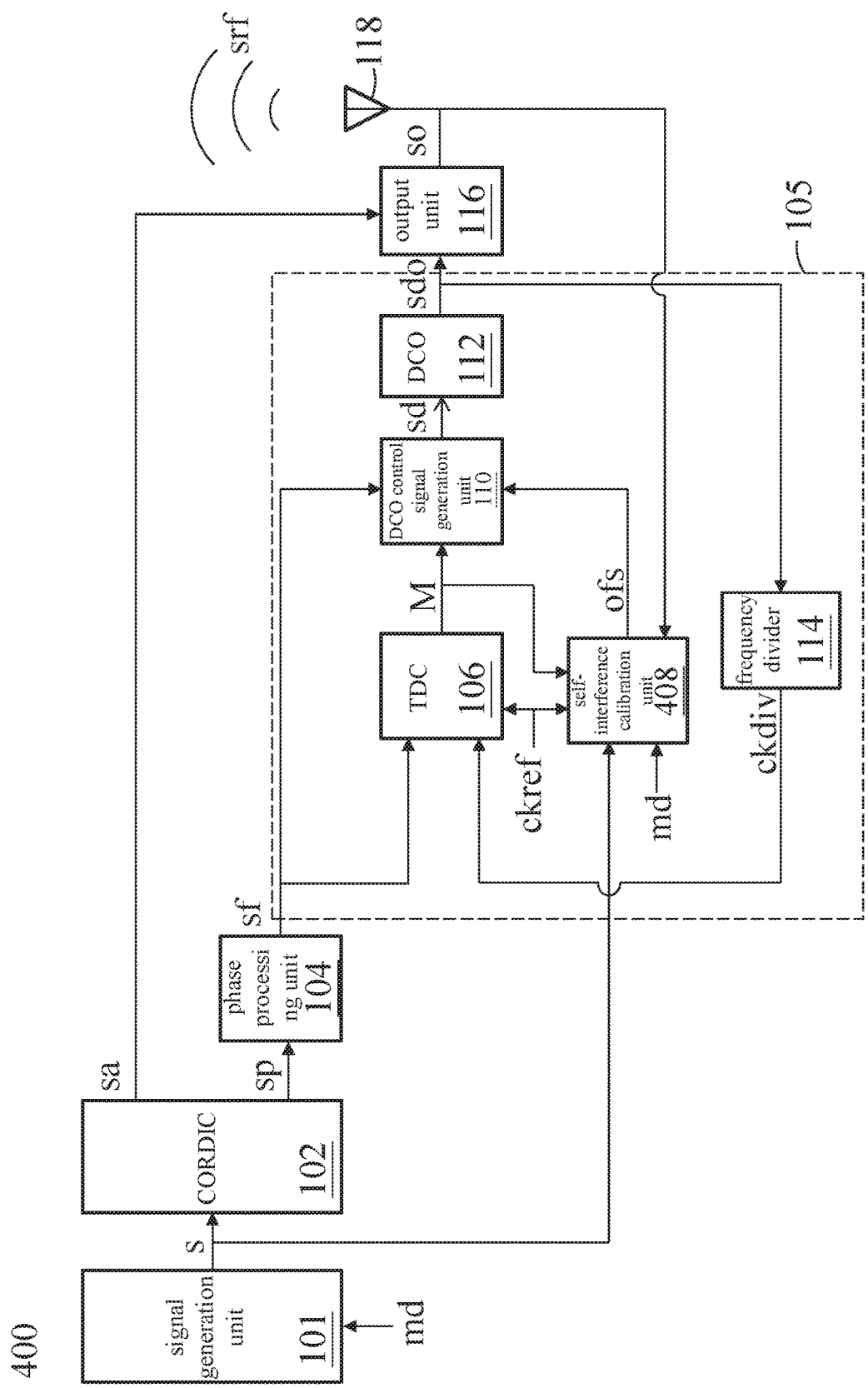
FIG. 4 is a schematic diagram illustrating a transmitter with self-interference calibration ability according to another embodiment.
Figure 5:
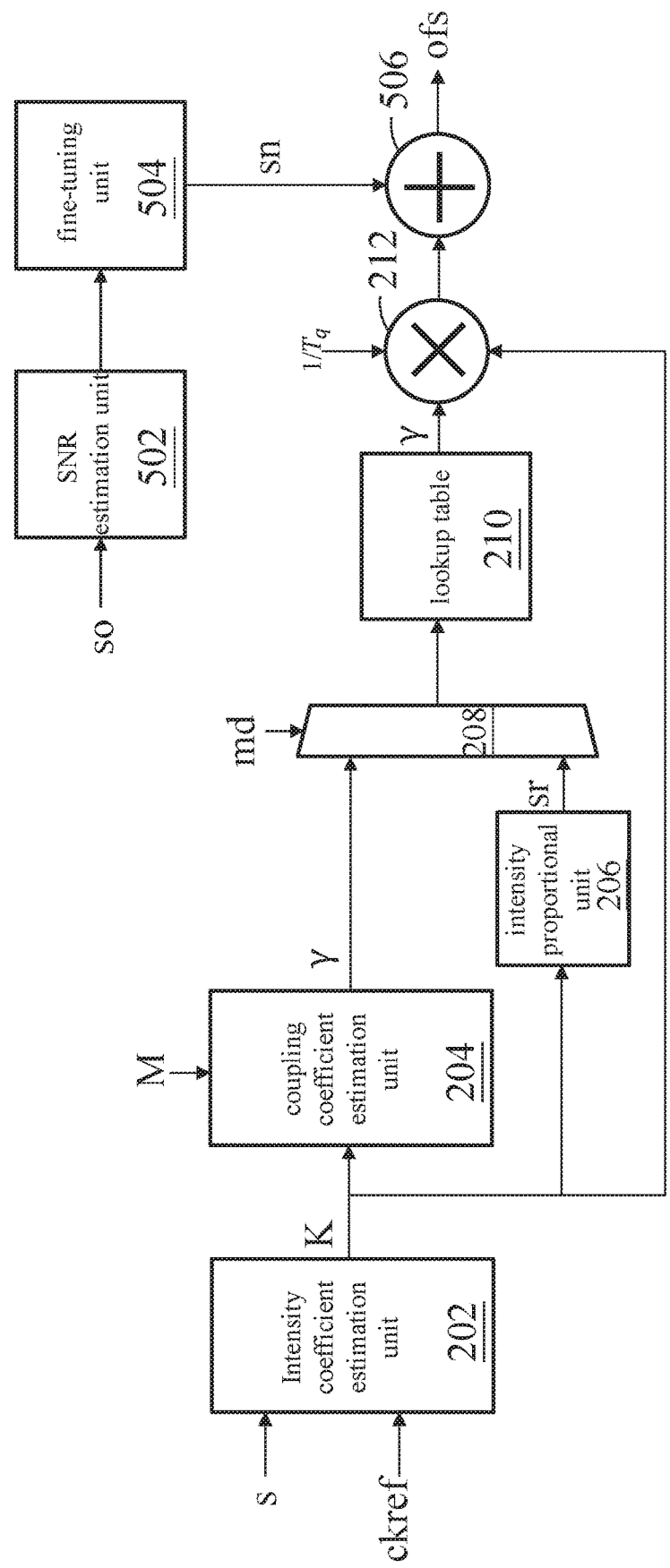
FIG. 5 is a schematic diagram illustrating an embodiment of a self-interference calibration unit of FIG. 4.
Figure 6:
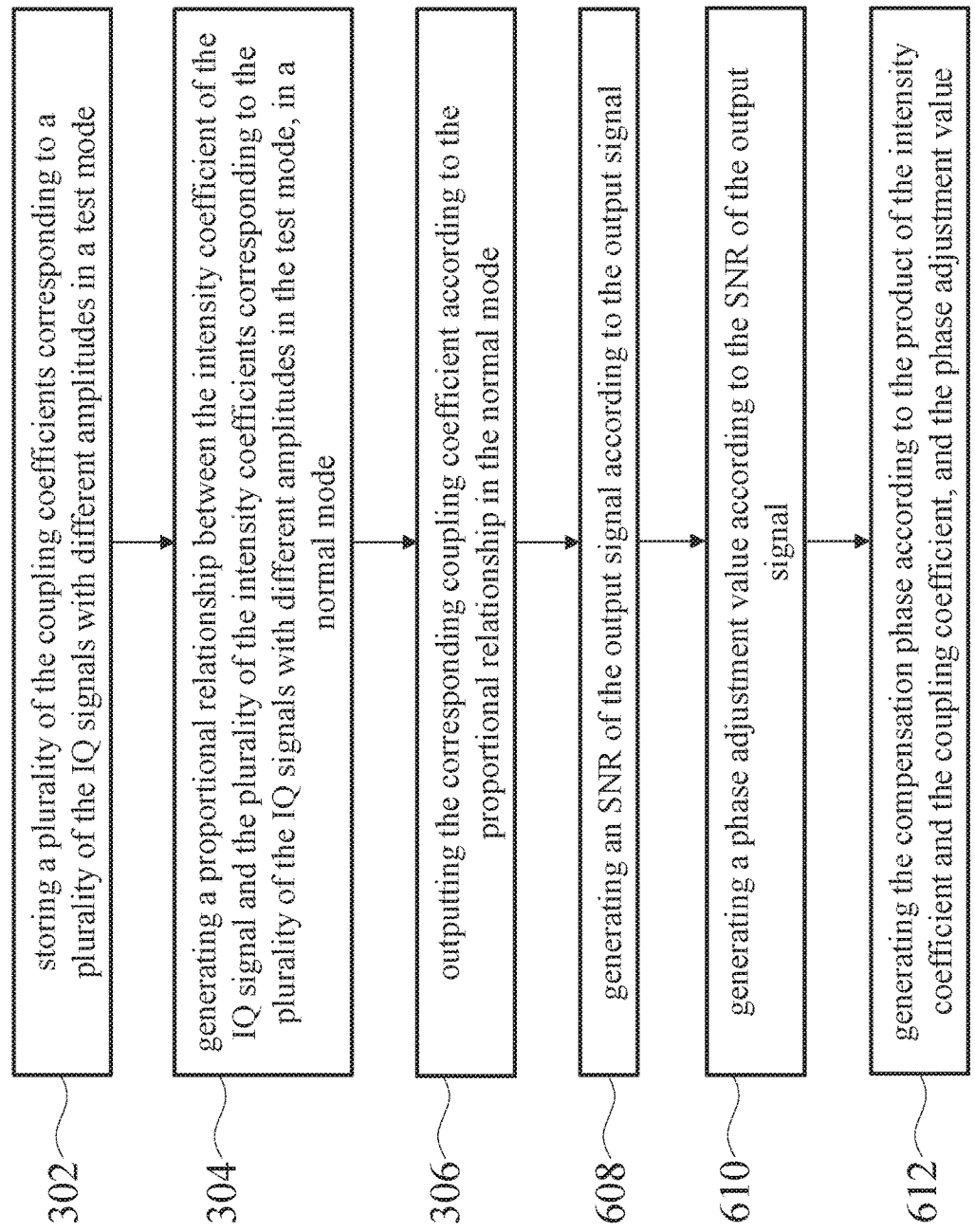
FIG. 6 shows the compensation method of the self-interference calibration unit of FIG. 4.

In some embodiments, the compensation phase ofs can be finetuned, so as to determine whether there is a better compensation phase ofs: for example, FIG. 4 is a schematic diagram illustrating a transmitter with self-interference calibration ability according to another embodiment of the present application. The self-interference calibration unit 408 of the transmitter 400 is further configured to generate a compensation phase ofs according to output signal so. FIG. 5 is a schematic diagram illustrating an embodiment of the self-interference calibration unit 408, and FIG. 6 is a related compensation method. The self-interference calibration unit 408 differs from the self-interference calibration unit 108 in that it further includes an SNR estimation unit 502 and a fine-tuning unit 504. The SNR estimation unit 502 generates the SNR of the output signal so according to the output signal so (Step 608), and the present application is not limited to any particular estimation method. The fine-tuning unit generates a phase adjustment value sn according to the SNR of the output signal so (Step 610); for example, within a specific phase adjustment range (say, ±5 smallest scale units of the compensation phase ofs), the scale unit that makes the output signal so to have a minimum SNR value is selected as the phase adjustment value sn; however, the present application is not limited thereto. Then, the multiplier 212 is used to multiply the coupling coefficient $\gamma_{mod}(i)$ with the intensity coefficient $K_{mod}(i)$ and $1/T_q$ to obtain a product, which is then added with the phase adjustment value sn using an adder 506 to obtained the finetuned compensation phase ofs (Step 612).

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A transmitter with self-interference calibration ability, comprising:
    a signal generation unit, configured to generate an IQ signal;
    a coordinate rotation digital computer (CORDIC), configured to generate an amplitude modulation signal and a phase modulation signal according to the IQ signal;
    a phase processing unit, configured to generate a frequency signal according to the phase modulation signal;

a digital phase-locked loop (DPLL), comprising:
- a digitally controlled oscillator (DCO), configured to generate a DCO output signal according to a DCO control signal;
- a frequency divider, configured to divide frequency of the DCO output signal using a frequency dividing parameter to generate a frequency divided signal;
- a time-to-digital converter, configured to generate a phase difference according to the frequency signal, the frequency divided signal and a reference clock;
- a self-interference calibration unit, configured to generate a compensation phase according to the IQ signal, the phase difference and the reference clock; and
- a DCO control signal generation unit, configured to generate the DCO control signal according to the frequency signal, the phase difference and the compensation phase; and an output unit, configured to generate an output signal according to the amplitude modulation signal and the DCO output signal.

2. The transmitter of claim 1, wherein the self-interference calibration unit comprises:
- an intensity coefficient estimation unit, configured to generate an intensity coefficient according to the IQ signal and the reference clock; and
- a coupling coefficient estimation unit, configured to generate a coupling coefficient according to the intensity coefficient and the phase difference.

3. The transmitter of claim 2, wherein the self-interference calibration unit further comprises:
- a lookup table, configured to store a plurality of the coupling coefficients corresponding to a plurality of the IQ signals with different amplitudes in a test mode.

4. The transmitter of claim 3, wherein the self-interference calibration unit further comprises:
- an intensity proportional unit, coupled to the intensity coefficient estimation unit, configured to generate a proportional relationship between the intensity coefficient of the IQ signal and the plurality of the coupling coefficients corresponding to the plurality of the IQ signals with different amplitudes in the test mode, in a normal mode.

5. The transmitter of claim 4, wherein the lookup table is further configured to output the corresponding coupling coefficient according to the proportional relationship in the normal mode.

6. The transmitter of claim 5, wherein the self-interference calibration unit generates the compensation phase according to a product of the intensity coefficient and the coupling coefficient.

7. The transmitter of claim 6, wherein the self-interference calibration unit further comprises:
- an SNR estimation unit, configured to generate an SNR of the output signal according to the output signal.

8. The transmitter of claim 7, wherein the self-interference calibration unit further comprises:
- a fine-tuning unit, configured to generate a phase adjustment value according to the SNR of the output signal; and
- wherein the self-interference calibration unit generates the compensation phase further according to the phase adjustment value.

9. The transmitter of claim 8, wherein the fine-tuning unit selects a phase that makes the SNR of the output signal have a relative minimum value from a specific phase adjustment range as the phase adjustment value.

10. The transmitter of claim 3, wherein in the test mode, the IQ signal is a sine wave.

11. A transmission method with self-interference calibration ability, comprising:
- generating an IQ signal;
- generating an amplitude modulation signal and a phase modulation signal according to the IQ signal;
- generating a frequency signal according to the phase modulation signal;
- generating a DCO output signal according to a DCO control signal;
- using a frequency dividing parameter to divide frequency of the DCO output signal so as to generate a frequency divided signal;
- generating a phase difference according to the frequency signal, the frequency divided signal and a reference clock;
- generating a compensation phase according to the IQ signal, the phase difference and the reference clock;
- generating the DCO control signal according to the frequency signal, the phase difference and the compensation phase; and
- generating an output signal according to the amplitude modulation signal and the DCO output signal.

12. The transmission method of claim 11, wherein the step of generating the compensation phase according to the IQ signal, the phase difference and the reference clock comprises:
- generating an intensity coefficient according to the IQ signal and the reference clock; and
- generating a coupling coefficient according to the intensity coefficient and the phase difference.

13. The transmission method of claim 12, wherein the step of generating the compensation phase according to the IQ signal, the phase difference and the reference clock to further comprises:
- storing a plurality of the coupling coefficients corresponding to a plurality of the IQ signals with different amplitudes in a test mode.

14. The transmission method of claim 13, wherein the step of generating the compensation phase according to the IQ signal, the phase difference and the reference clock further comprises:
- generating a proportional relationship between the intensity coefficient of the IQ signal and the plurality of the coupling coefficients corresponding to the plurality of the IQ signals with different amplitudes in the test mode, in a normal mode.

15. The transmission method of claim 14, wherein the step of generate the compensation phase according to the IQ signal, the phase difference and the reference clock further comprises:
- outputting the corresponding coupling coefficient according to the proportional relationship in the normal mode.

16. The transmission method of claim 15, wherein the step of generating the compensation phase according to the IQ signal, the phase difference and the reference clock further comprises:
- generating the compensation phase according to a product of the intensity coefficient and the coupling coefficient.

17. The transmission method of claim 16, wherein the step of generating the compensation phase according to the IQ signal, the phase difference and the reference clock further comprises:
- generating an SNR of the output signal according to the output signal.

18. The transmission method of claim 17, wherein the step of generating the compensation phase according to the IQ signal, the phase difference and the reference clock further comprises:
- generating a phase adjustment value according to the SNR of the output signal; and the step of generating the compensation phase according to the product of the intensity coefficient and the coupling coefficient comprises:
- generating the compensation phase according to the product of the intensity coefficient and the coupling coefficient, and the phase adjustment value.

19. The transmission method of claim 18, wherein the step of generating the phase adjustment value according to the SNR of the output signal comprises:
- selecting a phase that makes the SNR of the output signal have a relative minimum value from a specific phase adjustment range as the phase adjustment value.

20. The transmission method of claim 13, wherein in the test mode, the IQ signal is a sine wave.

* * * * *